United States Patent
Badakere Govindaiah et al.

(10) Patent No.: US 8,120,150 B2
(45) Date of Patent: Feb. 21, 2012

(54) INTEGRATED CIRCUIT PACKAGE SYSTEM WITH DUAL CONNECTIVITY

(75) Inventors: Guruprasad Badakere Govindaiah, Singapore (SG); Zigmund Ramirez Camacho, Singapore (SG); Jeffrey D. Punzalan, Singapore (SG); Henry Descalzo Bathan, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 635 days.

(21) Appl. No.: 11/857,402

(22) Filed: Sep. 18, 2007

(65) Prior Publication Data

US 2009/0072366 A1 Mar. 19, 2009

(51) Int. Cl.
*H01L 23/495* (2006.01)
*H01L 21/44* (2006.01)

(52) U.S. Cl. . 257/676; 257/667; 257/730; 257/E23.043; 257/E23.129; 438/123; 438/124

(58) Field of Classification Search ............... 257/667, 257/676, 730, E23.043, E23.046, E23.123, 257/E23.129; 438/123, 124
See application file for complete search history.

(56) References Cited

U.S. PATENT DOCUMENTS

| | | | |
|---|---|---|---|
| 5,677,566 A | 10/1997 | King et al. | |
| 6,297,543 B1 | 10/2001 | Hong et al. | |
| 6,316,822 B1 | 11/2001 | Venkateshwaran et al. | |
| 6,611,048 B1 | 8/2003 | Fazelpour et al. | |
| 6,818,973 B1 * | 11/2004 | Foster | 257/676 |
| 6,876,068 B1 * | 4/2005 | Lee et al. | 257/676 |
| 6,943,061 B1 | 9/2005 | Sirinorakul et al. | |
| 6,977,431 B1 * | 12/2005 | Oh et al. | 257/696 |
| 7,049,177 B1 * | 5/2006 | Fan et al. | 257/676 |
| 7,161,232 B1 | 1/2007 | Lee et al. | |
| 7,193,298 B2 * | 3/2007 | Hong et al. | 257/666 |
| 7,211,471 B1 | 5/2007 | Foster | |
| 7,253,529 B2 | 8/2007 | Tao et al. | |
| 7,384,819 B2 | 6/2008 | Yip et al. | |
| 2008/0017994 A1 | 1/2008 | Do et al. | |
| 2008/0179729 A1 | 7/2008 | Shim et al. | |

* cited by examiner

*Primary Examiner* — Matthew E Warren
(74) *Attorney, Agent, or Firm* — Mikio Ishimaru

(57) ABSTRACT

An integrated circuit package system includes: forming a die-attach paddle, a terminal pad, and an external interconnect with the external interconnect below the terminal pad; connecting an integrated circuit die with the terminal pad and the external interconnect; and forming an encapsulation, having a first side and a second side at an opposing side to the first side, surrounding the integrated circuit die with the terminal pad exposed at the first side and the external interconnect extending below the second side.

20 Claims, 13 Drawing Sheets

INTEGRATED CIRCUIT PACKAGE SYSTEM WITH DUAL CONNECTIVITY

TECHNICAL FIELD

The present invention relates generally to integrated circuit package system and more particularly to integrated circuit package system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside in integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O or a large number of I/Os in an ever-shrinking space.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Bond wires electrically connect the bond pads, of the semiconductor die, to a series of conductive lead fingers on the topside of the lead frame. Typically, the semiconductor die and the bond wires are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume while providing connectivity to a large number of I/O. Despite the trend towards miniaturization and thinner profile, more functions and more integrated circuits are continued to be packed into QFP packages.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a die-attach paddle, a terminal pad, and an external interconnect with the external interconnect below the terminal pad; connecting an integrated circuit die with the terminal pad and the external interconnect; and forming an encapsulation, having a first side and a second side at an opposing side to the first side, surrounding the integrated circuit die with the terminal pad exposed at the first side and the external interconnect extending below the second side.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
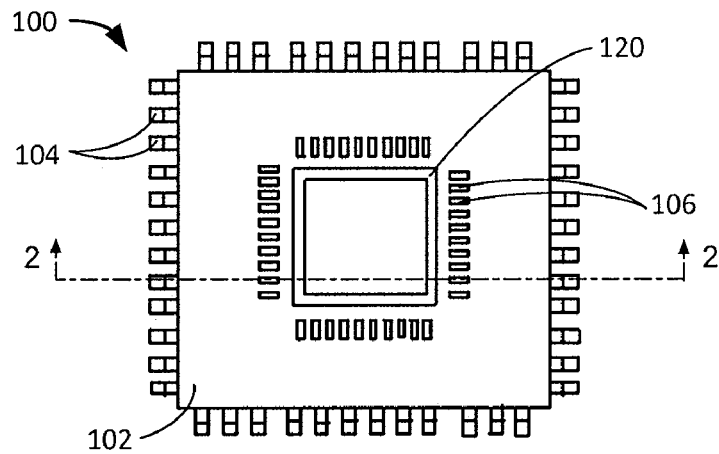
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as of an epoxy molded compound, with external interconnects 104 partially exposed and extending peripherally from of the encapsulation 102. For example, the external interconnects 104 may be leads for the integrated circuit package system 100 in a quad flat package type. Terminal pads 106 provided away from the periphery of the encapsulation 102 are also exposed by the encapsulation 102. The encapsulation 102 preferably undergoes an isolation process, such as grinding, to break connections between a die-attach paddle 120 and the terminal pads 106 and to partially expose the terminal pads 106 for connections to an additional integrated circuit device structure, not shown.

Figure 2:
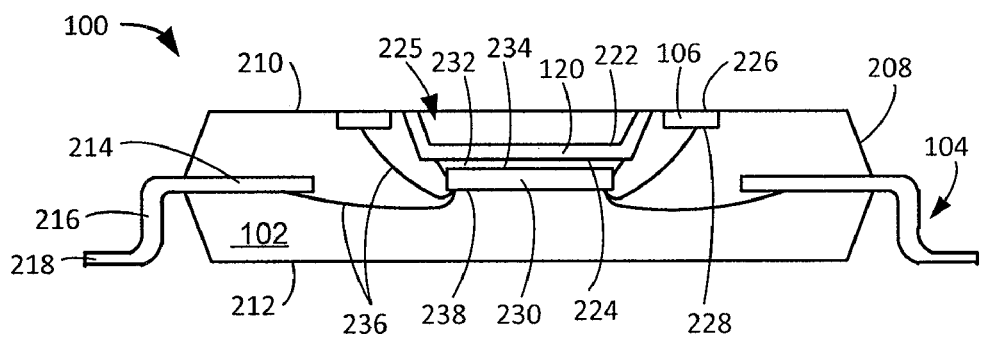
FIG. 2 is a cross-sectional view of the integrated circuit package system of FIG. 1 along a line 2-2.

Referring now to FIG. 2, therein is shown the cross-sectional view of the integrated circuit package system 100 of FIG. 1 along a line 2-2. The cross-sectional view depicts the encapsulation 102 having the external interconnects 104 extending from lateral sides 208 of the encapsulation 102. The encapsulation 102 includes a first encapsulation side 210 intersecting one of the lateral sides 208 and a second encapsulation side 212 on an opposing side of the first encapsulation side 210. The external interconnects 104 can be below and isolated from the terminal pads 106. Each of the external interconnects 104 preferably includes a tip 214, a post 216, and a termination 218. The termination 218 allows mounting to the next system levels (not shown), such as a printed circuit board or a further integrated circuit package system. Preferably, the termination 218 extends below the second encapsulation side 212 such that the encapsulation 102 does not impede the connections of the external interconnects 104 and the next system level.

The die-attach paddle 120 is provided having a first paddle side 222 and a second paddle side 224 on an opposing side of the first paddle side 222. The die-attach paddle 120 can include a recess 225 completely bounded by a non-horizontal extent at an obtuse angle with the first paddle side 222. The terminal pads 106 are formed adjacent to the die-attach paddle 120. Each of the terminal pads 106 include a first pad side 226 and a second pad side 228, wherein the second pad side 228 is at an opposing side of the first pad side 226, with the first pad side 226 preferably coplanar with the first encapsulation side 210.

An integrated circuit die 230 may be mounted with an adhesive 232 under the die-attach paddle 120, with a non-active side 234 of the integrated circuit die 230 facing the second paddle side 224. Electrical interconnects 236, such as bond wires or ribbon bonds, electrically connect an active side 238 of the integrated circuit die 230 to the second pad side 228 and a predetermined selection of the tip 214 of the external interconnects 104. It is understood that the terminal pads 106 can be electrically connected to various signals such as, for example, reference source, signals and ground.

The encapsulation 102 covers the integrated circuit die 230, the electrical interconnects 236, and the die-attach paddle 120. The first encapsulation side 210 preferably undergoes an isolation process, such as grinding, to break the contacts between the die-attach paddle 120 and the terminal pads 106 and to partially expose the first pad side 226 on the first encapsulation side 210 for connections to an additional integrated circuit device structure, not shown. Preferably, the post 216 and the termination 218 of the external interconnects 104 are exposed by the encapsulation 102 to allow mounting to the next system level (not shown), such as a printed circuit board or a further integrated circuit package system. 0058 It has been discovered that the present invention provides the integrated circuit package system 100 with reduced profile and high I/O connectivity by providing the terminal pads 106 along the first encapsulation side 210 for allowing attachment to another integrated circuit device at the terminal pads 106, while also allowing attachment of the integrated circuit package system 100 to a next system level connection at the second encapsulation side 212. This dual connectivity option increases the I/O connection to the integrated circuit package system 100 and mitigates aggressive pitch requirement for the terminal pads 106 and the external interconnects 104 as well as connection to the next system level.

Figure 3:
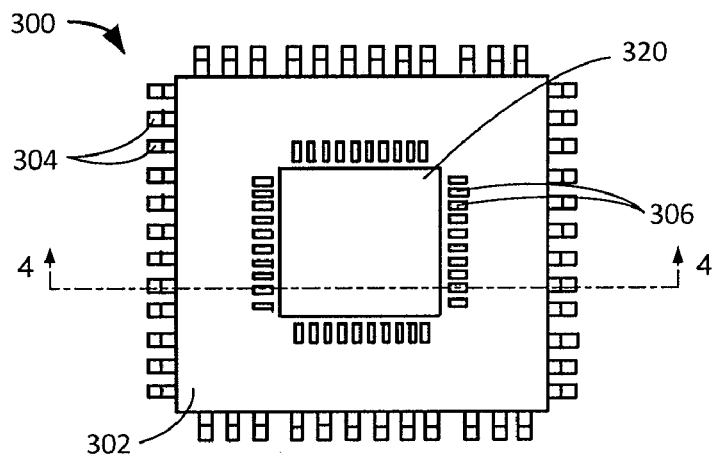
FIG. 3 is a top view of an integrated circuit package system in a second embodiment of the present invention.

Referring now to FIG. 3, therein is shown a top view of an integrated circuit package system 300 in a second embodiment of the present invention. The integrated circuit package system 300 includes structural similarities to the integrated circuit package system 100 of FIG. 1.

The top view depicts an encapsulation 302, such as of an epoxy molded compound, with external interconnects 304 partially exposed and extending peripherally from of the encapsulation 302.

It is understood that the external interconnects 304 may be a number of types of leads. For example, the external interconnects 304 may be leads for the integrated circuit package system 300 in a quad flat package type. Terminal pads 306 provided away from the periphery of the encapsulation 302 are also exposed by the encapsulation 302. In this embodiment, a die-attach paddle 320 is partially exposed by the encapsulation 302.

Figure 4:
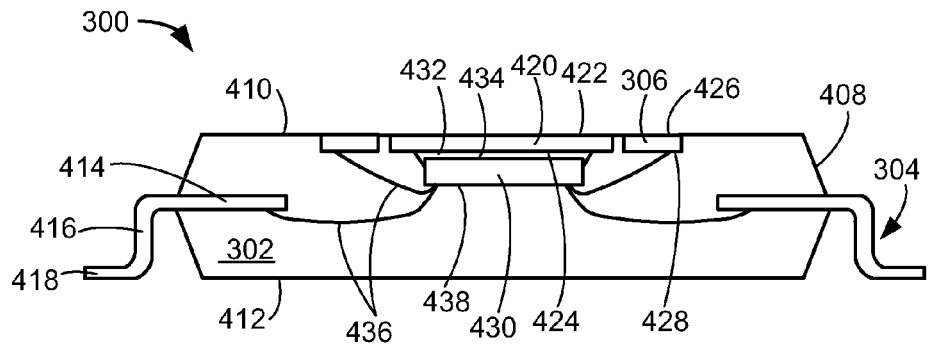
FIG. 4 is a cross-sectional view of the integrated circuit package system of FIG. 3 along a line 4-4.

Referring now to FIG. 4, therein is shown the cross-sectional view of the integrated circuit package system 300 of FIG. 3 along a line 4-4. The cross-sectional view depicts the encapsulation 302 having the external interconnects 304 extending from lateral sides 408 of the encapsulation 302. The encapsulation 302 includes a first encapsulation side 410 intersecting one of the lateral sides 408 and a second encapsulation side 412 on an opposing side of the first encapsulation side 410.

Each of the external interconnects 304 preferably includes a tip 414, a post 416, and a termination 418. The termination 418 allows mounting to the next system levels (not shown), such as a printed circuit board or a further integrated circuit package system. Preferably, the termination 418 extend below the second encapsulation side 412 such that the encapsulation 302 does not impede the connections of the external interconnects 304 and the next system level.

A die-attach paddle 420 is provided having a first paddle side 422 and a second paddle side 424 on an opposing side of the first paddle side 422. The terminal pads 306 are formed adjacent to the die-attach paddle 420. Each of the terminal pads 306 includes a first pad side 426 and a second pad side 428, wherein the second pad side 428 is at an opposing side of the first pad side 426, with the first pad side 426 preferably coplanar with the first encapsulation side 410.

An integrated circuit die 430 may be mounted with an adhesive 432 under the die-attach paddle 420, with a non-active side 434 of the integrated circuit die 430 facing the second paddle side 424. Electrical interconnects 436, such as bond wires or ribbon bonds, electrically connect an active side 438 of the integrated circuit die 430 to the second pad side 428 and a predetermined selection of the tip 414 of the external interconnects 304. It is understood that the terminal pads 306 can be electrically connected to various signals such as, for example, reference source, signals and ground.

The encapsulation 302 covers the integrated circuit die 430 and the electrical interconnects 436. The encapsulation 302 partially covers the die-attach paddle 420, the terminal pads 306 and the external interconnects 304, preferably exposing the first paddle side and the first pad side 426 on the first encapsulation side 410 for connections to an additional integrated circuit device structure, not shown. Preferably, the post 416 and the termination 418 of the external interconnects 304 are exposed by the encapsulation 302 to allow mounting to the next system levels (not shown), such as a printed circuit board or a further integrated circuit package system.

It has been discovered that the present invention provides the integrated circuit package system 300 with reduced profile and high I/O connectivity by providing the terminal pads 306 along the first encapsulation side 410 for allowing attachment to another integrated circuit device at the terminal pad, while also allowing attachment of the integrated circuit package system 300 to a next system level connection at the second encapsulation side 412. This dual connectivity option increases the I/O connection to the integrated circuit package system 300 and mitigates aggressive pitch requirement for the terminal pads 306 and the external interconnects 304 as well as the next system level.

In addition, the die-attach paddle with the terminal pads may be connected to a reference, such as ground reference, allowing for ground connections for the integrated circuit die while leaving the external leads to connect to signals. In one sample application of this invention, connecting the terminal pads to power or ground, frees up the external leads to be used for signals that may otherwise be tied to the ground reference. This also reduces the design constraint for a package with finer lead pitch thereby facilitating manufacturing and assembly onto a printed circuit board (PCB). In another sample application, with the die-attach paddle and terminal pads electrically connected to a ground reference, the invention also provides an electromagnetic interference (EMI) shield or radio frequency (RF) shield.

Figure 5:
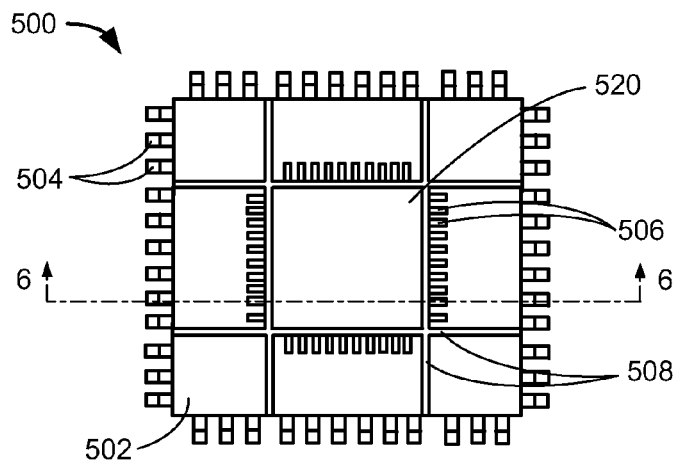
FIG. 5 is a top view of an integrated circuit package system in a third embodiment of the present invention.

Referring now to FIG. 5, therein is shown a top view of an integrated circuit package system 500 in a third embodiment of the present invention. The integrated circuit package system 500 includes structural similarities to the integrated circuit package system 300 of FIG. 3.

The top view depicts an encapsulation 502, such as of an epoxy molded compound, with external interconnects 504 partially exposed and extending peripherally from of the encapsulation 502.

Terminal pads 506 provided away from the periphery of the encapsulation 502 are also exposed by the encapsulation 502. In this embodiment, a die-attach paddle 520, coplanar to the terminal pads 506, is partially exposed by the encapsulation 502, and partial cuts 508 in the encapsulation 502 are formed adjacent to the terminal pads 506. The partial cuts 508, such as by sawing, etching, or drilling, isolate and break the contacts between the die-attach paddle 520 and the terminal pads 506.

Figure 6:
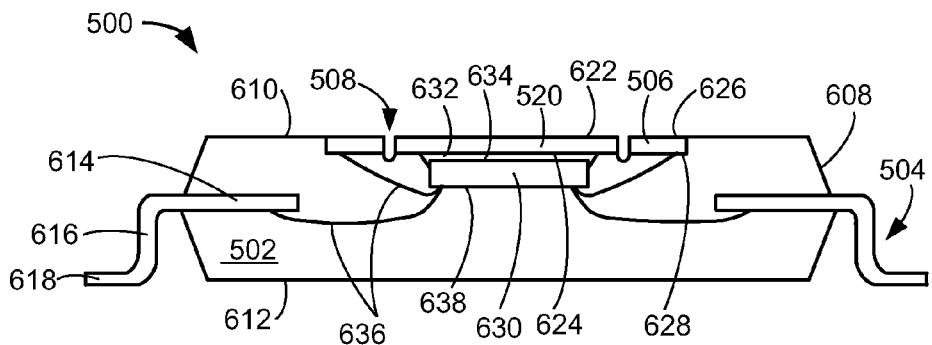
FIG. 6 is a cross-sectional view of the integrated circuit package system of FIG. 5 along a line 6-6.

Referring now to FIG. 6, therein is shown the cross-sectional view of the integrated circuit package system 500 of FIG. 5 along a line 6-6. The cross-sectional view depicts the encapsulation 502 having the external interconnects 504 extending from lateral sides 608 of the encapsulation 502. The encapsulation 502 includes a first encapsulation side 610 intersecting one of the lateral sides 608 and a second encapsulation side 612 on an opposing side of the first encapsulation side 610.

Each of the external interconnects 504 preferably includes a tip 614, a post 616, and a termination 618. The termination 618 allows mounting to the next system levels (not shown), such as a printed circuit board or a further integrated circuit package system. Preferably, the termination 618 extend below the second encapsulation side 612 such that the encapsulation 502 does not impede the connections of the external interconnects 504 and the next system level.

The die-attach paddle 520 is provided having a first paddle side 622 and a second paddle side 624 on an opposing side of the first paddle side 622. The terminal pads 506 are formed adjacent to the die-attach paddle 520. Each of the terminal pads 506 include a first pad side 626 and a second pad side 628, wherein the second pad side 628 is at an opposing side of the first pad side 626, with the first pad side 626 preferably coplanar with the first encapsulation side 610.

An integrated circuit die 630 may be mounted with an adhesive 632 under the die-attach paddle 520, with a non-active side 634 of the integrated circuit die 630 facing the second paddle side 624. Electrical interconnects 636, such as bond wires or ribbon bonds, electrically connect an active side 638 of the integrated circuit die 630 to the second pad side 628 and a predetermined selection of the tip 614 of the external interconnects 504. It is understood that the terminal pads 506 can be electrically connected to various signals such as, for example, reference source, signals and ground.

The encapsulation 502 covers the integrated circuit die 630 and the electrical interconnects 636. The encapsulation 502 partially covers the die-attach paddle 520, the terminal pads 506 and the external interconnects 504, preferably exposing the first paddle side and the first pad side 626 on the first encapsulation side 610 for connections to additional integrated circuit device structure, not shown. The partial cuts 508 are formed in the first encapsulation side 610, with the partial cuts 508 formed to break contacts between the die-attach paddle 520 and the terminal pads 506. In this embodiment, the partial cuts 508 are made between the die-attach paddle 520 and the terminal pads 506. Preferably, the post 616 and the termination 618 of the external interconnects 504 are exposed by the encapsulation 502 to allow mounting to the next system levels (not shown), such as a printed circuit board or a further integrated circuit package system.

Figure 7:
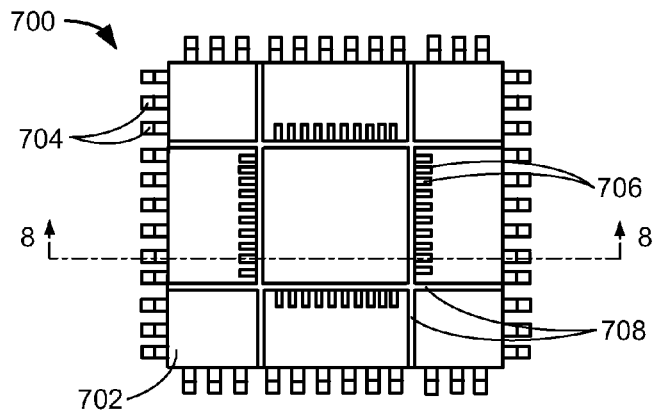
FIG. 7 is a top view of an integrated circuit package system in a fourth embodiment of the present invention.

Referring now to FIG. 7, therein is shown a top view of an integrated circuit package system 700 in a fourth embodiment of the present invention. The integrated circuit package system 700 includes structural similarities to the integrated circuit package system 500 of FIG. 5. The top view depicts an encapsulation 702, such as of an epoxy molded compound, exposing terminal pads 706 and external interconnects 704 partially exposed and extending peripherally from of the encapsulation 702.

It is understood that the external interconnects 704 may be a number of types of leads. For example, the external interconnects 704 may be leads for the integrated circuit package system 700 in a quad flat package type. Partial cuts 708 are made in the encapsulation 702 adjacent to the terminal pads 706.

Figure 8:
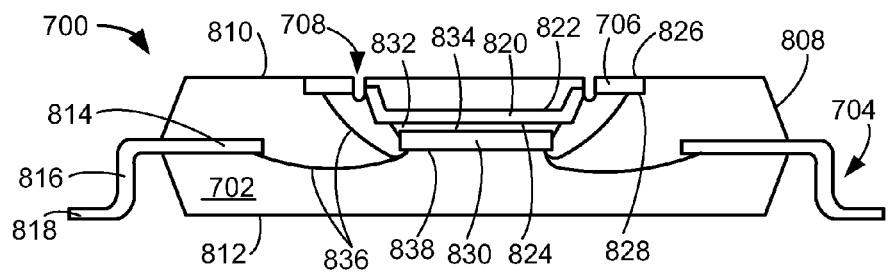
FIG. 8 is a cross-sectional view of the integrated circuit package system of FIG. 7 along a line 8-8.

Referring now to FIG. 8, therein is shown a cross-sectional view of the integrated circuit package system 700 of FIG. 7 along a line 8-8. The integrated circuit package system 700 includes structural similarities to the integrated circuit package system 500 of FIG. 5. The cross-sectional view depicts the encapsulation 702 having the external interconnects 704 extending from lateral sides 808 of the encapsulation 702. The encapsulation 702 includes a first encapsulation side 810 intersecting one of the lateral sides 808 and a second encapsulation side 812 on an opposing side of the first encapsulation side 810.

Each of the external interconnects 704 preferably includes a tip 814, a post 816, and a termination 818. The termination 818 allows mounting to the next system levels (not shown), such as a printed circuit board or a further integrated circuit package system. Preferably, the termination 818 extend below the second encapsulation side 812 such that the encapsulation 702 does not impede the connections of the external interconnects 704 and the next system level.

A die-attach paddle 820 is provided having a first paddle side 822 and a second paddle side 824 on an opposing side of the first paddle side 822. The terminal pads 706 are formed adjacent to the die-attach paddle 820. Each of the terminal pads 706 includes a first pad side 826 and a second pad side 828, wherein the second pad side 828 is at an opposing side of the first pad side 826, with the first pad side 826 preferably coplanar with the first encapsulation side 810.

An integrated circuit die 830 may be mounted with an adhesive 832 under the die-attach paddle 820, with a non-active side 834 of the integrated circuit die 830 facing the second paddle side 824. Electrical interconnects 836, such as bond wires or ribbon bonds, electrically connect an active side 838 of the integrated circuit die 830 to the second pad side 828 and a predetermined selection of the tip 814 of the external interconnects 704. It is understood that the terminal pads 706 can be electrically connected to various signals such as, for example, reference source, signals and ground.

The encapsulation 702 covers the integrated circuit die 830, the electrical interconnects 836, and the die-attach paddle 820. The encapsulation 702 partially covers the terminal pads 706 and the external interconnects 704 exposing the first pad side 826 on the first encapsulation side 810 for connections to additional integrated circuit device structure, not shown. The partial cuts 708 are formed in the first encapsulation side 810, with the partial cuts 708 formed to break contacts between the die-attach paddle 820 and the terminal pads 706. In this embodiment, the partial cuts 708 are made between the die-attach paddle 820 and the terminal pads 706. Preferably, the post 816 and the termination 818 of the external interconnects 704 are exposed by the encapsulation 702 to allow mounting to the next system levels (not shown), such as a printed circuit board or a further integrated circuit package system.

Figure 9:
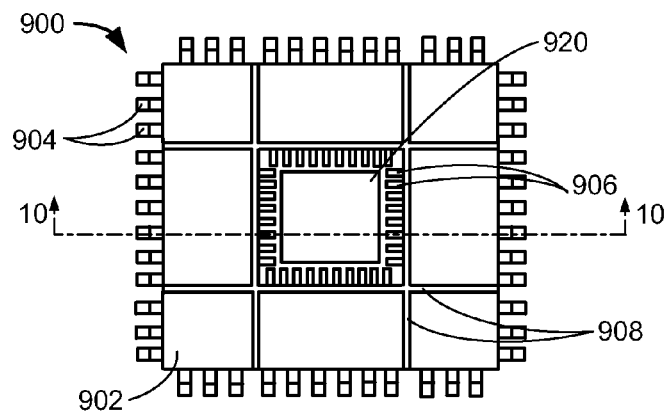
FIG. 9 is a top view of an integrated circuit package system in a fifth embodiment of the present invention.

Referring now to FIG. 9, therein is shown a top view of an integrated circuit package system 900 in a fifth embodiment of the present invention. The integrated circuit package system 900 includes structural similarities to the integrated circuit package system 500 of FIG. 5. The top view depicts an encapsulation 902, such as of an epoxy molded compound, with external interconnects 904 partially exposed and extending peripherally from of the encapsulation 902.

It is understood that the external interconnects 904 may be a number of types of leads. For example, the external interconnects 904 may be leads for the integrated circuit package system 900 in a quad flat package type. Terminal pads 906 provided away from the periphery of the encapsulation 902 are also exposed by the encapsulation 902. In this embodiment, a die-attach paddle 920, coplanar to the terminal pads 906, is partially exposed by the encapsulation 902 and partial cuts 908 in the encapsulation 902 are formed adjacent to the terminal pads 906 between the terminal pads 906 and the external interconnects 904.

Figure 10:
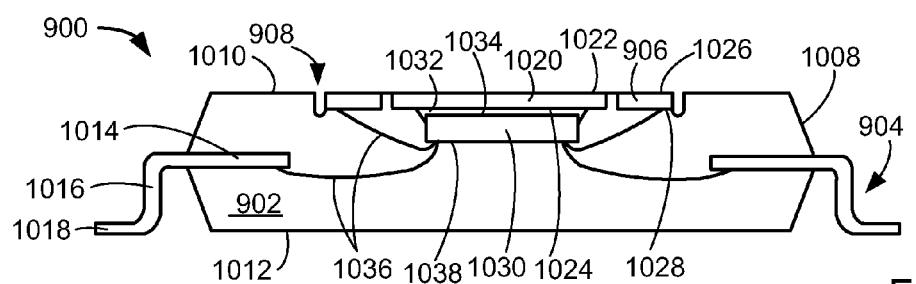
FIG. 10 is a cross-sectional view of the integrated circuit package system of FIG. 9 along a line 10-10.

Referring now to FIG. 10, therein is shown the cross-sectional view of the integrated circuit package system 900 of FIG. 9 along a line 10-10. The cross-sectional view depicts the encapsulation 902 having the external interconnects 904 extending from lateral sides 1008 of the encapsulation 902. The encapsulation 902 includes a first encapsulation side 1010 intersecting one of the lateral sides 1008 and a second encapsulation side 1012 on an opposing side of the first encapsulation side 1010.

Each of the external interconnects 904 preferably includes a tip 1014, a post 1016, and a termination 1018. The termination 1018 allows mounting to the next system levels (not shown), such as a printed circuit board or a further integrated circuit package system. Preferably, the termination 1018 extend below the second encapsulation side 1012 such that the encapsulation 902 does not impede the connections of the external interconnects 904 and the next system level.

A die-attach paddle 1020 is provided having a first paddle side 1022 and a second paddle side 1024 on an opposing side of the first paddle side 1022. The terminal pads 906 are formed adjacent and coplanar to the die-attach paddle 1020. Each of the terminal pads 906 include a first pad side 1026 and a second pad side 1028, wherein the second pad side 1028 is at an opposing side of the first pad side 1026, with the first pad side 1026 preferably coplanar with the first encapsulation side 1010.

An integrated circuit die 1030 may be mounted with an adhesive 1032 under the die-attach paddle 1020, with a non-active side 1034 of the integrated circuit die 1030 facing the second paddle side 1024. Electrical interconnects 1036, such as bond wires or ribbon bonds, electrically connect an active side 1038 of the integrated circuit die 1030 to the second pad side 1028 and a predetermined selection of the tip 1014 of the external interconnects 904. It is understood that the terminal pads 906 can be electrically connected to various signals such as, for example, reference source, signals and ground.

The encapsulation 902 covers the integrated circuit die 1030 and the electrical interconnects 1036. The encapsulation 902 partially covers the die-attach paddle 1020, the terminal pads 906 and the external interconnects 904, preferably exposing the first paddle side and the first pad side 1026 on the first encapsulation side 1010 for connections to additional integrated circuit device structure, not shown. In this embodiment, the partial cuts 908 are made between the terminal pads 906 and the external interconnects 904. Preferably, the post 1016 and the termination 1018 of the external interconnects 904 are exposed by the encapsulation 902 to allow mounting to the next system levels (not shown), such as a printed circuit board or a further integrated circuit package system.

Figure 11:
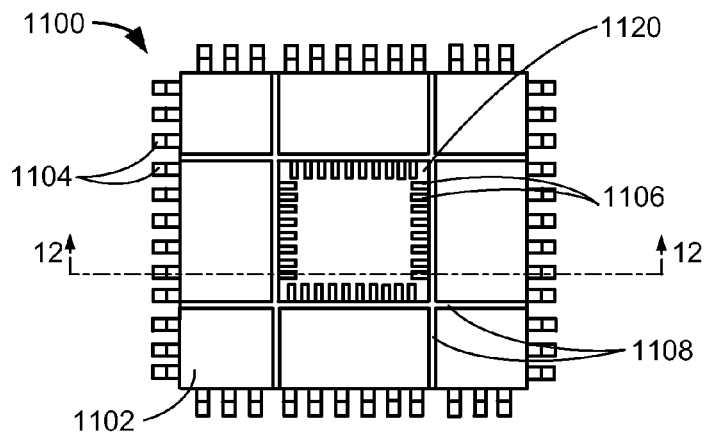
FIG. 11 is a top view of an integrated circuit package system in a sixth embodiment of the present invention.

Referring now to FIG. 11, therein is shown a top view of an integrated circuit package system 1100 in a sixth embodiment of the present invention. The integrated circuit package system 1100 includes structural similarities to the integrated circuit package system 900 of FIG. 9. The top view depicts an encapsulation 1102, such as of an epoxy molded compound, with external interconnects 1104 partially exposed and extending peripherally from of the encapsulation 1102.

It is understood that the external interconnects 1104 may be a number of types of leads. For example, the external interconnects 1104 may be leads for the integrated circuit package system 1100 in a quad flat package type. Terminal pads 1106 provided away from the periphery of the encapsulation 1102 are also exposed by the encapsulation 1102. In this embodiment, partial cuts 1108 in the encapsulation 1102 are formed adjacent to the terminal pads 1106 between the terminal pads 1106 and the external interconnects 1104.

Figure 12:
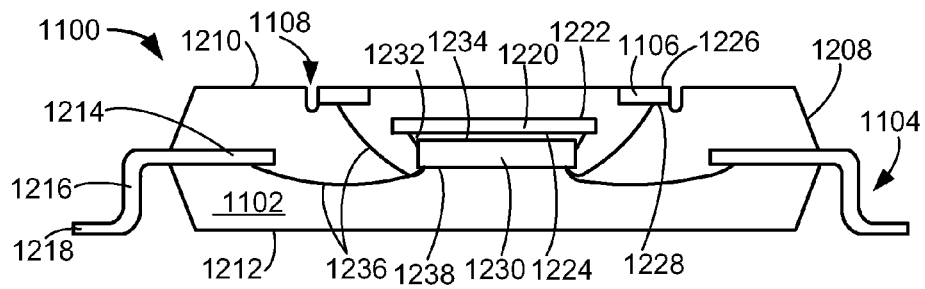
FIG. 12 is a cross-sectional view of the integrated circuit package system of FIG. 1 along a line 12-12.

Referring now to FIG. 12, therein is shown the cross-sectional view of the integrated circuit package system 1100 of FIG. 11 along a line 12-12. The cross-sectional view depicts the encapsulation 1102 having the external interconnects 1104 extending from lateral sides 1208 of the encapsulation 1102. The encapsulation 1102 includes a first encapsulation side 1210 intersecting one of the lateral sides 1208 and a second encapsulation side 1212 on an opposing side of the first encapsulation side 1210.

Each of the external interconnects 1104 preferably includes a tip 1214, a post 1216, and a termination 1218. The termination 1218 allows mounting to the next system levels (not shown), such as a printed circuit board or a further integrated circuit package system. Preferably, the termination 1218 extend below the second encapsulation side 1212 such that the encapsulation 1102 does not impede the connections of the external interconnects 1104 and the next system level.

A die-attach paddle 1220 is provided having a first paddle side 1222 and a second paddle side 1224 on an opposing side of the first paddle side 1222. The terminal pads 1106 are formed adjacent to the die-attach paddle 1220. Each of the terminal pads 1106 include a first pad side 1226 and a second pad side 1228, wherein the second pad side 1228 is at an opposing side of the first pad side 1226, with the first pad side 1226 preferably coplanar with the first encapsulation side 1210.

An integrated circuit die 1230 may be mounted with an adhesive 1232 under the die-attach paddle 1220, with a non-active side 1234 of the integrated circuit die 1230 facing the second paddle side 1224. Electrical interconnects 1236, such as bond wires or ribbon bonds, electrically connect an active side 1238 of the integrated circuit die 1230 to the second pad side 1228 and a predetermined selection of the tip 1214 of the external interconnects 1104. It is understood that the terminal pads 1106 can be electrically connected to various signals such as, for example, reference source, signals and ground.

The encapsulation 1102 covers the integrated circuit die 1230, the die-attach paddle 1220 and the electrical interconnects 1236. The encapsulation 1102 partially covers the terminal pads 1106 and the external interconnects 1104 exposing the first pad side 1226 on the first encapsulation side 1210 for connections to additional integrated circuit device structure, not shown. In this embodiment, the partial cuts 1108 are made between the terminal pads 1106 and the external interconnects 1104. Preferably, the post 1216 and the termination 1218 of the external interconnects 1104 are exposed by the encapsulation 1102 to allow mounting to the next system levels (not shown), such as a printed circuit board or a further integrated circuit package system.

Figure 13:
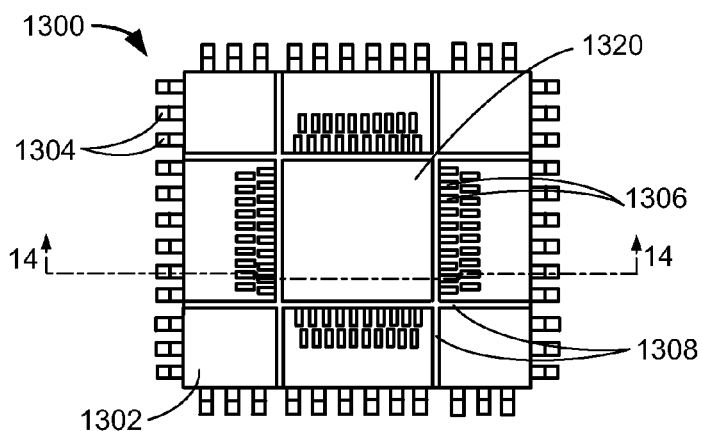
FIG. 13 is a top view of an integrated circuit package system in a seventh embodiment of the present invention.

Referring now to FIG. 13, therein is shown a top view of an integrated circuit package system 1300 in a seventh embodiment of the present invention. The integrated circuit package system 1300 includes structural similarities to the integrated circuit package system 500 of FIG. 5. The top view depicts an encapsulation 1302, such as of an epoxy molded compound, with external interconnects 1304 partially exposed and extending peripherally from of the encapsulation 1302.

It is understood that the external interconnects 1304 may be a number of types of leads. For example, the external interconnects 1304 may be leads for the integrated circuit package system 1300 in a quad flat package type. Terminal pads 1306 provided away from the periphery of the encapsulation 1302 are also exposed by the encapsulation 1302. In this embodiment, a die-attach paddle 1320, coplanar to the terminal pads 1306, is partially exposed by the encapsulation 1302, and partial cuts 1308 in the encapsulation 1302 are formed adjacent to the terminal pads 1306. The terminal pads 1306 are formed in multi-row to provide increased number of I/O connectivity.

Figure 14:
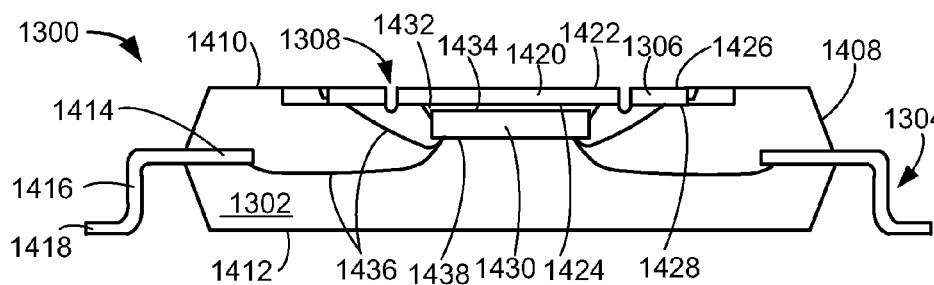
FIG. 14 is a cross-sectional view of an integrated circuit package system as exemplified by the top view of FIG. 13 along a line 14-14.

Referring now to FIG. 14, therein is shown the cross-sectional view of the integrated circuit package system 1300 of FIG. 13 along a line 14-14. The cross-sectional view depicts the encapsulation 1302 having the external interconnects 1304 extending from lateral sides 1408 of the encapsulation 1302. The encapsulation 1302 includes a first encapsulation side 1410 intersecting one of the lateral sides 1408 and a second encapsulation side 1412 on an opposing side of the first encapsulation side 1410.

Each of the external interconnects 1304 preferably includes a tip 1414, a post 1416, and a termination 1418. The termination 1418 allows mounting to the next system levels (not shown), such as a printed circuit board or a further integrated circuit package system. Preferably, the termination 1418 extend below the second encapsulation side 1412 such that the encapsulation 1302 does not impede the connections of the external interconnects 1304 and the next system level.

A die-attach paddle 1420 is provided having a first paddle side 1422 and a second paddle side 1424 on an opposing side of the first paddle side 1422. Multiple rows of the terminal pads 1306 are formed adjacent and preferably coplanar to the die-attach paddle 1420. Each of the terminal pads 1306 include a first pad side 1426 and a second pad side 1428, wherein the second pad side 1428 is at an opposing side of the first pad side 1426, with the first pad side 1426 preferably coplanar with the first encapsulation side 1410.

An integrated circuit die 1430 may be mounted with an adhesive 1432 under the die-attach paddle 1420, with a non-active side 1434 of the integrated circuit die 1430 facing the second paddle side 1424. Electrical interconnects 1436, such as bond wires or ribbon bonds, electrically connect an active side 1438 of the integrated circuit die 1430 to the second pad side 1428 and a predetermined selection of the tip 1414 of the external interconnects 1304. It is understood that the terminal pads may be electrically connected to various signals such as, for example, reference source, signals and ground. It is also understood that the number of rows and configuration of the multiple rows of the terminal pads 1306 are not critical and may be adapted by design needs.

The encapsulation 1302 covers the integrated circuit die 1430 and the electrical interconnects 1436. The encapsulation 1302 partially covers the die-attach paddle 1420, the terminal pads 1306 and the external interconnects 1304, preferably exposing the first paddle side 1422 and the first pad side 1426 on the first encapsulation side 1410 for connections to additional integrated circuit device structure, not shown.

The partial cuts 1308 are formed in the first encapsulation side 1410, with the partial cuts 1308 formed to break contacts between the die-attach paddle 1420 and the terminal pads 1306. In this embodiment, the partial cuts 1308 are made between the die-attach paddle 1420 and the terminal pads 1306, although it is understood that the partial cuts 1308 in the encapsulation 1302 may alternatively be made between the terminal pads 1306 and the external interconnects 1304 described similarly above. Preferably, the post 1416 and the termination 1418 of the external interconnects 1304 are also exposed by the encapsulation 1302 to allow mounting to the next system levels (not shown), such as a printed circuit board or a further integrated circuit package system.

Figure 15:
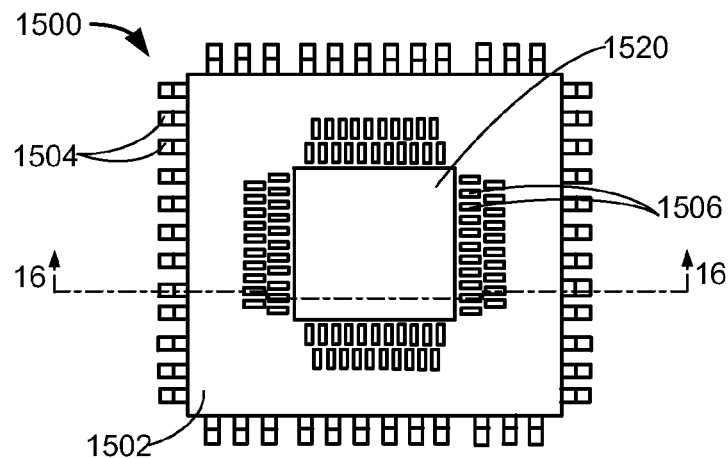
FIG. 15 is a top view of an integrated circuit package system in an eighth embodiment of the present invention.

Referring now to FIG. 15, therein is shown a top view of an integrated circuit package system 1500 in an eighth embodiment of the present invention. The integrated circuit package system 1500 includes structural similarities to the integrated circuit package system 1300 of FIG. 13. The top view depicts an encapsulation 1502, such as of an epoxy molded compound, with external interconnects 1504 partially exposed and extending peripherally from of the encapsulation 1502.

It is understood that the external interconnects 1504 may be a number of types of leads. For example, the external interconnects 1504 may be leads for the integrated circuit package system 1500 in a quad flat package type. Terminal pads 1506 provided away from the periphery of the encapsulation 1502 are also exposed by the encapsulation 1502. In this embodiment, a die-attach paddle 1520, coplanar to the terminal pads 1506, is partially exposed by the encapsulation 1502. The terminal pads 1506 are formed in multiple rows to provide increased number of I/O connectivity.

Figure 16:
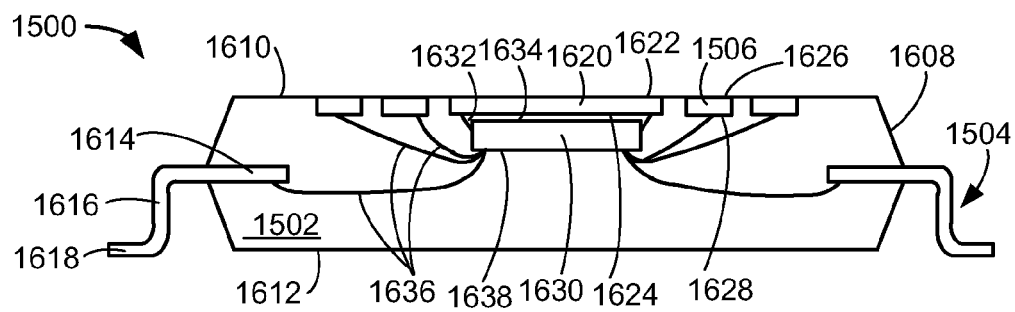
FIG. 16 is a cross-sectional view of the integrated circuit package system as exemplified by the top view of FIG. 15 along a line 16-16.

Referring now to FIG. 16, therein is shown the cross-sectional view of the integrated circuit package system 1500 of FIG. 15 along a line 16-16. The cross-sectional view depicts the encapsulation 1502 having the external interconnects 1504 extending from lateral sides 1608 of the encapsulation 1502. The encapsulation 1502 includes a first encapsulation side 1610 intersecting one of the lateral sides 1608 and a second encapsulation side 1612 on an opposing side of the first encapsulation side 1610.

Each of the external interconnects 1504 preferably includes a tip 1614, a post 1616, and a termination 1618. The termination 1618 allows mounting to the next system levels (not shown), such as a printed circuit board or a further integrated circuit package system. Preferably, the termination 1618 extend below the second encapsulation side 1612 such that the encapsulation 1502 does not impede the connections of the external interconnects 1504 and the next system level.

A die-attach paddle 1620 is provided having a first paddle side 1622 and a second paddle side 1624 on an opposing side of the first paddle side 1622. Multiple rows of the terminal pads 1506 are formed adjacent and preferably coplanar to the die-attach paddle 1620. Each of the terminal pads 1506 includes a first pad side 1626 and a second pad side 1628, wherein the second pad side 1628 is at an opposing side of the first pad side 1626, with the first pad side 1626 preferably coplanar with the first encapsulation side 1610.

An integrated circuit die 1630 may be mounted with an adhesive 1632 under the die-attach paddle 1620, with a non-active side 1634 of the integrated circuit die 1630 facing the second paddle side 1624. Electrical interconnects 1636, such as bond wires or ribbon bonds, electrically connect an active side 1638 of the integrated circuit die 1630 to the second pad side 1628 and a predetermined selection of the tip 1614 of the external interconnects 1504. It is understood that the terminal pads may be electrically connected to various signals such as, for example, reference source, signals and ground. It is also understood that the number of rows and configuration of the multi-rows of the terminal pads 1506 is not critical and may be adapted by design needs.

The encapsulation 1502 covers the integrated circuit die 1630 and the electrical interconnects 1636. The encapsulation 1502 partially covers the die-attach paddle 1620, the terminal pads 1506 and the external interconnects 1504, preferably exposing the first paddle side and the first pad side 1626 on the first encapsulation side 1610 for connections to additional integrated circuit device structure, not shown. Preferably, the post 1616 and the termination 1618 of the external interconnects 1504 are also exposed by the encapsulation 1502 to allow mounting to the next system levels (not shown), such as a printed circuit board or a further integrated circuit package system.

In one sample application of this invention, connecting the terminal pads to power or ground, frees up the external leads to be used for signals that may otherwise be tied to power or ground reference. This also reduces the design constraint for a package with finer lead pitch thereby facilitating manufacturing and assembly onto a printed circuit board (PCB). In another sample application, with the die-attach paddle and terminal pads electrically connected to a ground reference, the invention also provides an electromagnetic interference (EMI) shield or radio frequency (RF) shield.

Figure 17:
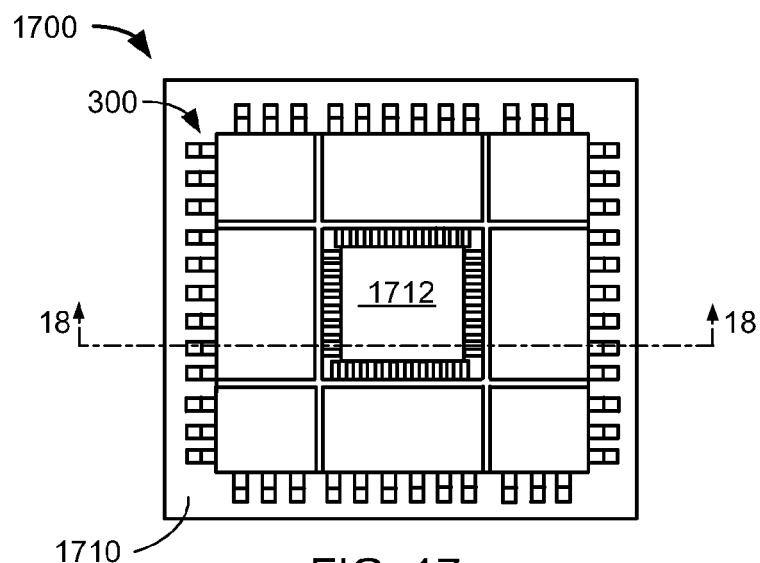
FIG. 17 is a top view of an integrated circuit package system in a ninth embodiment of the present invention.

Referring now to FIG. 17, therein is shown a top view of an integrated circuit package system 1700 in a ninth embodiment of the present invention. The top view depicts the integrated circuit package system 300 mounted over a carrier 1710. An integrated circuit device 1712, such as a QFP device, is mounted over the integrated circuit package system 300 to form a package-on-package (POP) configuration.

Figure 18:
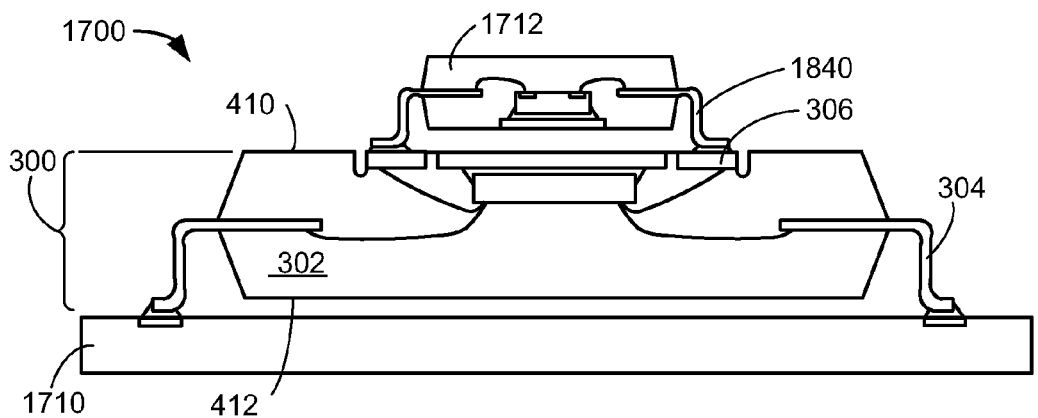
FIG. 18 is a cross-sectional view of the integrated circuit package system of FIG. 17 along a line 18-18.

Referring now to FIG. 18, therein is shown a cross-sectional view of the integrated circuit package system 1700 as exemplified by the top view of FIG. 17 along a line 18-18. The integrated circuit package system 300 includes the terminal pads 306 on the first encapsulation side 410 of the encapsulation 302 and the external interconnects 304 at the second encapsulation side 412, on an opposing side of the first encapsulation side 410, to connect to the carrier 1710.

The integrated circuit device 1712 is mounted over the integrated circuit package system 300 at the terminal pads 306. In this embodiment, the integrated circuit device 1712 includes a packaged integrated circuit with device interconnects 1840, wherein the device interconnects 1840 are electrically connected to the terminal pads 306. The external interconnects 304, partially exposed by the encapsulation 302 is electrically connected to the carrier 1710, while the terminal pads 306 provide electrical connection of the integrated circuit device 1712 to the integrated circuit package system 300 to provide a package-on-package (POP) configuration.

Figure 19:
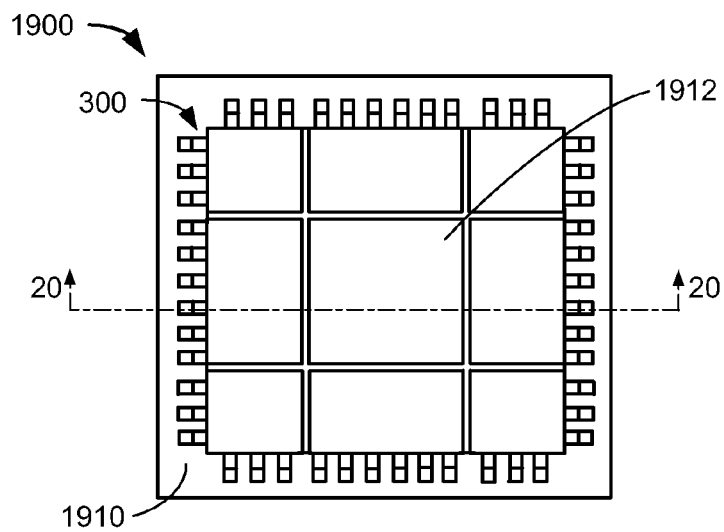
FIG. 19 is a top view of an integrated circuit package system in a tenth embodiment of the present invention.

Referring now to FIG. 19, therein is shown a top view of an integrated circuit package system 1900 in a tenth embodiment of the present invention. The top view depicts the integrated circuit package system 300 mounted over a carrier 1910. An integrated circuit device 1912, such as a QFN device, is mounted over the integrated circuit package system 300 to form a package-on-package (POP) configuration.

Figure 20:
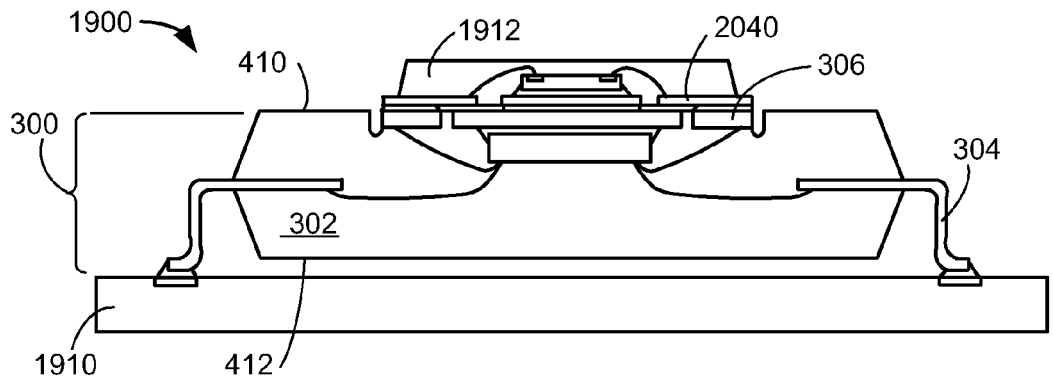
FIG. 20 is a cross-sectional view of the integrated circuit package system of FIG. 19 along a line 20-20.

Referring now to FIG. 20, therein is shown a cross-sectional view of the integrated circuit package system 1900 of FIG. 19 along a line 20-20. The integrated circuit package system 1900 includes structural similarities to the integrated circuit package system 1700 of FIG. 18. The integrated circuit package system 300 includes the terminal pads 306 on the first encapsulation side 410 of the encapsulation 302 and the external interconnects 304 at the second encapsulation side 412, on an opposing side of the first encapsulation side 410, to connect to the carrier 1910.

The integrated circuit device 1912 is mounted over the integrated circuit package system 300 at the terminal pads 306. In this embodiment, the integrated circuit device 1912 includes a packaged integrated circuit with device interconnects 2040, wherein the device interconnects 2040 are electrically connected to the terminal pads 306. The external interconnects 304, partially exposed by the encapsulation 302 is electrically connected to the carrier 1910, while the terminal pads 306 provide electrical connection of the integrated circuit device 1912 to the integrated circuit package system 300 to provide a package-on-package (POP) configuration.

Figure 21:
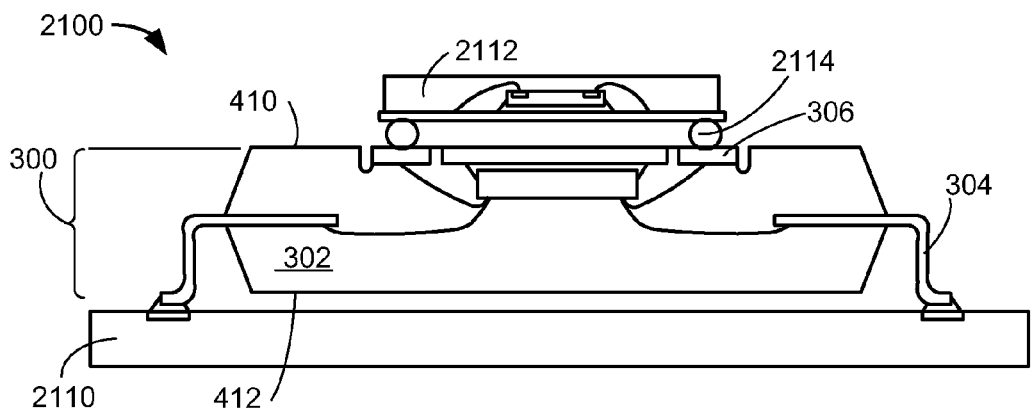
FIG. 21 is a cross-sectional view similar to FIG. 19 of an integrated circuit package system in an eleventh embodiment of the present invention.

Referring now to FIG. 21, therein is shown a cross-sectional view of an integrated circuit package system 2100 similar to FIG. 19 in an eleventh embodiment of the present invention. The integrated circuit package system 2100 includes structural similarities to the integrated circuit package system 1700 of FIG. 18. The integrated circuit package system 300 provides the terminal pads 306 on the first encapsulation side 410 of the encapsulation 302 and the external interconnects 304 at the second encapsulation side 412, on an opposing side of the first encapsulation side 410, to connect to a carrier 2110.

An integrated circuit device 2112, such as a packaged integrated circuit, is mounted over the integrated circuit package system 300 at the terminal pads 306. The integrated circuit device 2112 is mounted over the integrated circuit package system 300 at the terminal pads 306 forming a POP configuration. In this embodiment, the integrated circuit device 2112 includes solder balls 2114 that are electrically connected to the terminal pads 306. The external interconnects 304, partially exposed by the encapsulation 302 is electrically connected to the carrier 2110, while the terminal pads 306 are provided to electrically connect the integrated circuit device 2112 to the integrated circuit package system 300.

Figure 22:
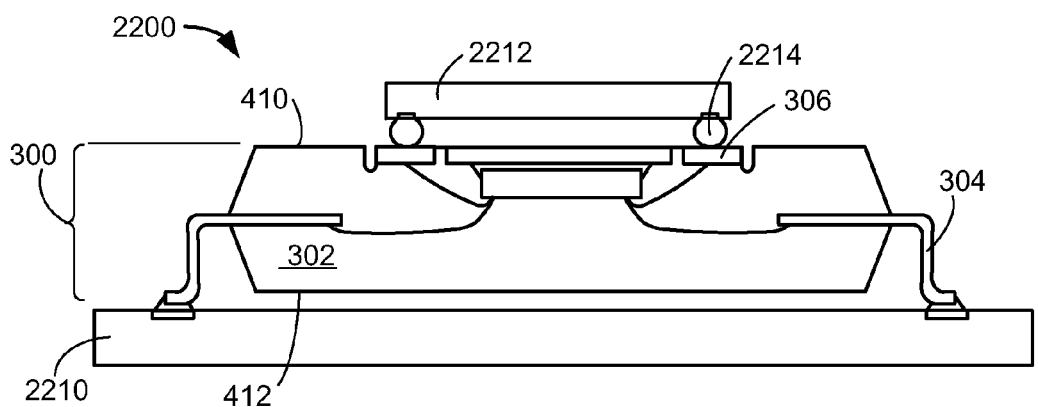
FIG. 22 is a cross-sectional view similar to FIG. 19 of an integrated circuit package system in a twelfth embodiment of the present invention.

Referring now to FIG. 22, therein is shown a cross-sectional view similar to FIG. 19 of an integrated circuit package system 2200 in a twelfth embodiment of the present invention. The integrated circuit package system 2200 includes structural similarities to the integrated circuit package system 1700 of FIG. 18. The integrated circuit package system 300 provides the terminal pads 306 on the first encapsulation side 410 of the encapsulation 302 and the external interconnects 304 at the second encapsulation side 412, on an opposing side of the first encapsulation side 410, to connect to a carrier 2210.

An integrated circuit device 2212, such as a flip chip, is mounted over the integrated circuit package system 300 at the terminal pads 306. The integrated circuit device 2212 is mounted over the integrated circuit package system 300 at the terminal pads 306 forming a POP configuration. In this embodiment, the integrated circuit device 2212 includes solder bumps 2214 that are electrically connected to the terminal pads 306. The external interconnects 304, partially exposed by the encapsulation 302 is electrically connected to the carrier 2210, while the terminal pads 306 are provided to electrically connect the integrated circuit device 2212 to the integrated circuit package system 300.

Figure 23:
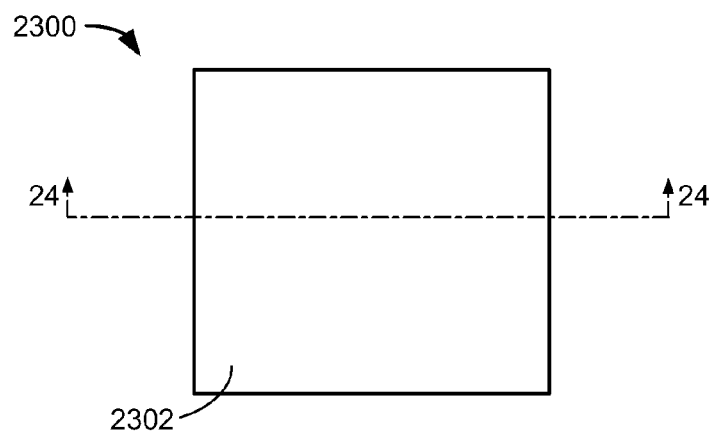
FIG. 23 is a top view of an integrated circuit package system in a thirteenth embodiment of the present invention.

Referring now to FIG. 23, therein is shown a top view of an integrated circuit package system 2300 in a thirteenth embodiment of the present invention. The top view shows the integrated circuit package system 2300 with a package encapsulation 2302 for forming a package-in-package (PIP) configuration.

Figure 24:
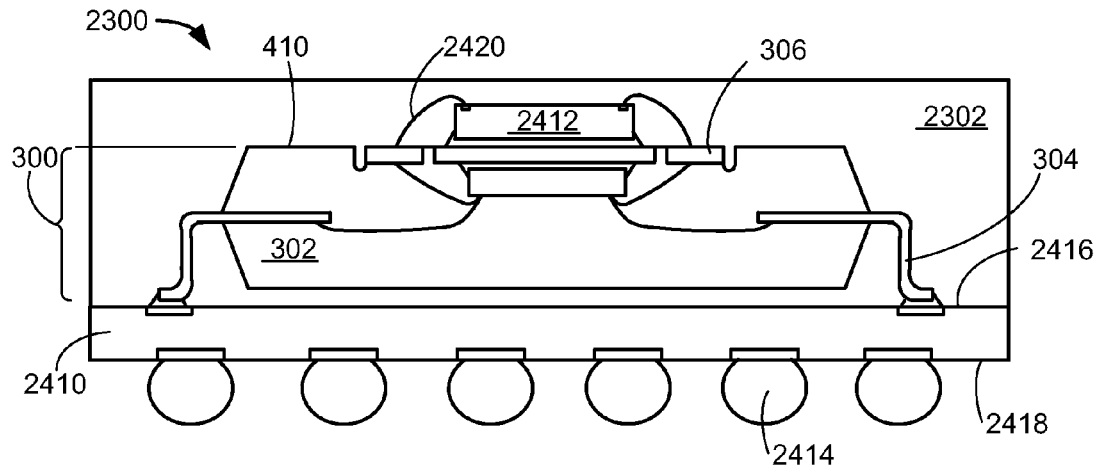
FIG. 24 is a cross-sectional view of the integrated circuit package system of FIG. 23 along a line 24-24.

Referring now to FIG. 24, therein is shown a cross-sectional view of the integrated circuit package system 2300 as exemplified by the top view of FIG. 23 along a line 24-24. The package encapsulation 2302 encapsulates the integrated circuit package system 300, as an example. The integrated circuit package system 300 provides the terminal pads 306 on the first encapsulation side 410 of the encapsulation 302. The external interconnects 304, partially exposed by the encapsulation 302, electrically connect the integrated circuit package system 300 to a first carrier side 2416 of a carrier 2410. The terminal pads 306 provide electrical connection of an integrated circuit device 2412, such as an integrated circuit die. The integrated circuit device 2412 is mounted over the integrated circuit package system 300 at the terminal pads 306 to provide a package-in-package (PIP) configuration.

In this embodiment, the integrated circuit device 2412 is electrically connected to the terminal pads 306 with device interconnects 2420, such as bond wires or ribbon bonds. The carrier 2410 also includes a second carrier side 2418, exposed by the package encapsulation 2302, with preferably second external interconnects such as solder balls 2414 formed on the second carrier side 2418 to provide electrical connection to the next system level.

Figure 25:
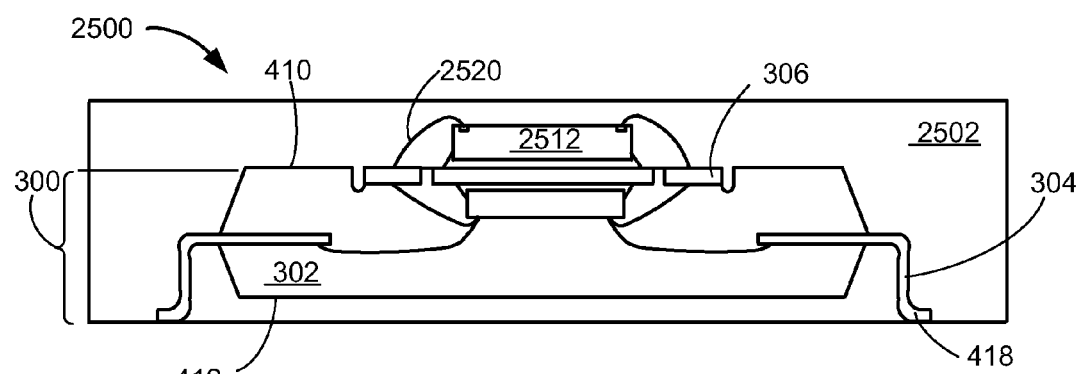
FIG. 25 is a cross-sectional view similar to FIG. 24 of an integrated circuit package system in a fourteenth embodiment of the present invention.

Referring now to FIG. 25, therein is shown a cross-sectional view similar to FIG. 23 of an integrated circuit package system 2500 in a fourteenth embodiment of the present invention. The integrated circuit package system 2500 includes structural similarities to the integrated circuit package system 2300 of FIG. 23. A package encapsulation 2502 encapsulates the integrated circuit package system 300. The integrated circuit package system 300 provides the terminal pads 306 on the first encapsulation side 410 of the encapsulation 302. The encapsulation 302 also partially exposed the external interconnects 304 of the integrated circuit package system 300, with the termination 418 of the external interconnects 304 extended below the second encapsulation side 412.

The terminal pads 306 provide electrical connection of the integrated circuit package system 300 to an integrated circuit device 2512, such as an integrated circuit die. The integrated circuit device 2512 is mounted over the integrated circuit package system 300 at the terminal pads 306 forming a package-in-package (PIP) configuration. The integrated circuit device 2512 is electrically connected to the terminal pads 306 with device interconnects 2520, such as bond wires or ribbon bonds. The termination 418 of each of the external interconnects 304 is partially exposed by the package encapsulation 2502 for electrical connection to the next system level (not shown).

Figure 26:
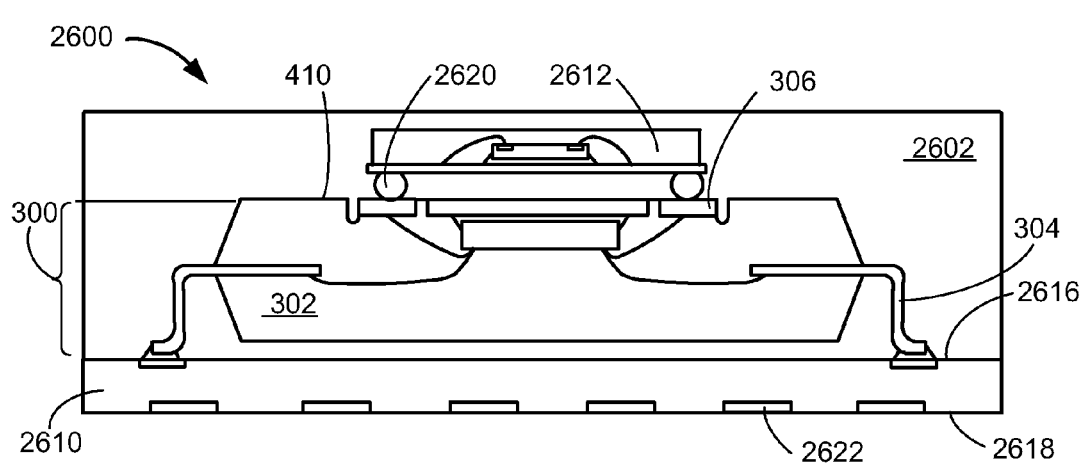
FIG. 26 is a cross-sectional view similar to to FIG. 24 of an integrated circuit package system in a fifteenth embodiment of the present invention.

Referring now to FIG. 26, therein is shown a cross-sectional view similar to FIG. 23 of an integrated circuit package system 2600 in a fifteenth embodiment of the present invention. The integrated circuit package system 2600 includes structural similarities to the integrated circuit package system 2300 of FIG. 23. A package encapsulation 2602 encapsulates the integrated circuit package system 300, as an example.

The integrated circuit package system 300 provides the terminal pads 306 on the first encapsulation side 410 of the encapsulation 302. The external interconnects 304, partially exposed by the encapsulation 302, electrically connect the integrated circuit package system 300 over a first carrier side 2616 of a carrier 2610. The terminal pads 306 provide electrical connection of the integrated circuit package system 300 to an integrated circuit device 2612.

In this embodiment, the integrated circuit device 2612 is a packaged integrated circuit, such as a ball grid array (BGA) package, mounted over the integrated circuit package system 300 at the terminal pads 306 forming a package-on-package (POP) configuration. The integrated circuit device 2612 is electrically connected to the terminal pads 306 with device interconnects 2620, such as solder bumps. The carrier 2610 also includes a second carrier side 2618, exposed by the package encapsulation 2602, with preferably electrical pads 2622 formed on the second carrier side 2618 for electrical connection to the next system level.

Figure 27:
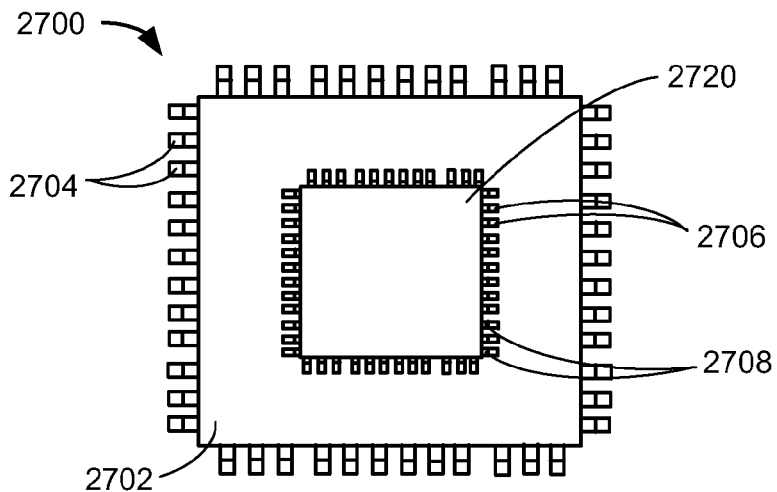
FIG. 27 is a top view of an integrated circuit package system in a sixteenth embodiment of the present invention.

Referring now to FIG. 27, therein is shown a top view of an integrated circuit package system 2700 in a sixteenth embodiment of the present invention. The integrated circuit package system 2700 includes structural similarities to the integrated circuit package system 500 of FIG. 5 and FIG. 6. The top view depicts an encapsulation 2702, such as of an epoxy molded compound, with external interconnects 2704 partially exposed and extending peripherally from the encapsulation 2702.

Terminal pads 2706 provided away from the periphery of the encapsulation 2702 are also exposed by the encapsulation 2702. A die-attach paddle 2720, coplanar to the terminal pads 2706, is partially exposed by the encapsulation 2702, and partial cuts 2708 in the encapsulation 2702 are formed adjacent to the terminal pads 2706. In this embodiment, the partial cuts 2708 are formed preferably by drilling isolation holes in the encapsulation 2702, such as to break contact and individually isolate each of the terminal pads 2706 from the die-attach paddle 2720.

Figure 28:
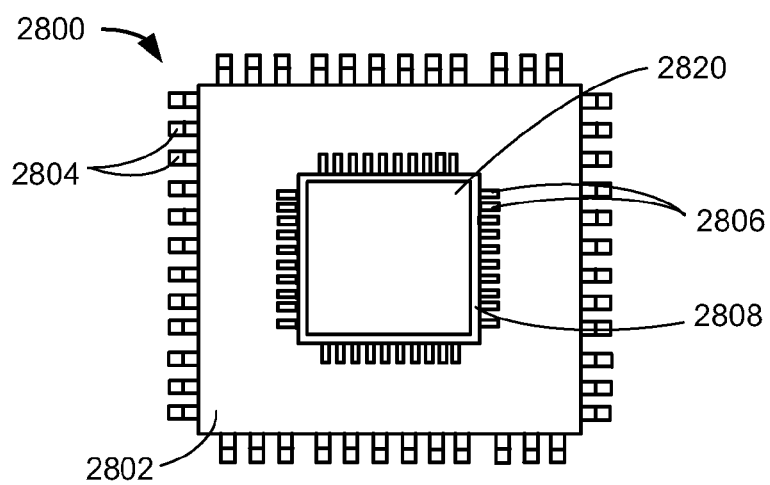
FIG. 28 is a top view of an integrated circuit package system in a seventeenth embodiment of the present invention.

Referring now to FIG. 28, therein is shown a top view of an integrated circuit package system 2800 in a seventeenth embodiment of the present invention. The integrated circuit package system 2800 includes structural similarities to the integrated circuit package system 500 of FIG. 5 and FIG. 6. The top view depicts an encapsulation 2802, such as of an epoxy molded compound, with external interconnects 2804 partially exposed and extending peripherally from the encapsulation 2802.

Terminal pads 2806 provided away from the periphery of the encapsulation 2802 are also exposed by the encapsulation 2802. A die-attach paddle 2820, coplanar to the terminal pads 2806, is partially exposed by the encapsulation 2802, and partial cuts 2808 in the encapsulation 2802 are formed adjacent to the terminal pads 2806. In this embodiment, the partial cuts 2808 are formed preferably by partially cutting, partially drilling, or partially sawing trenches in the encapsulation 2802, such as to break contact and isolate each of the terminal pads 2806 from the die-attach paddle 2820.

Figure 29:
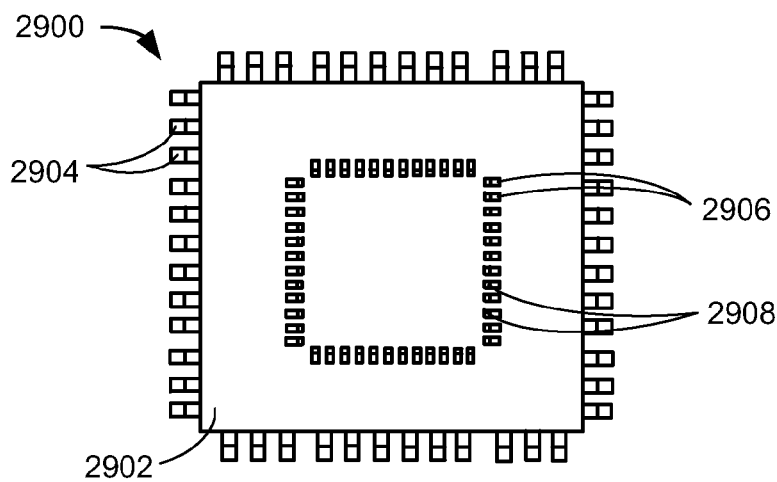
FIG. 29 is a top view of an integrated circuit package system in an eighteenth embodiment of the present invention.

Referring now to FIG. 29, therein is shown a top view of an integrated circuit package system 2900 in an eighteenth embodiment of the present invention. The integrated circuit package system 2900 includes structural similarities to the integrated circuit package system 700 of FIG. 8. The top view depicts an encapsulation 2902, such as of an epoxy molded compound, with external interconnects 2904 partially exposed and extending peripherally from the encapsulation 2902.

Terminal pads 2906 provided away from the periphery of the encapsulation 2902 are also exposed by the encapsulation 2902. Partial cuts 2908 in the encapsulation 2902 are formed adjacent to the terminal pads 2906. In this embodiment, the partial cuts 2908 are formed preferably by drilling isolation holes in the encapsulation 2902, such as to break contact and individually isolate each of the terminal pads 2906 from an encapsulated die-attach paddle (not shown).

Figure 30:
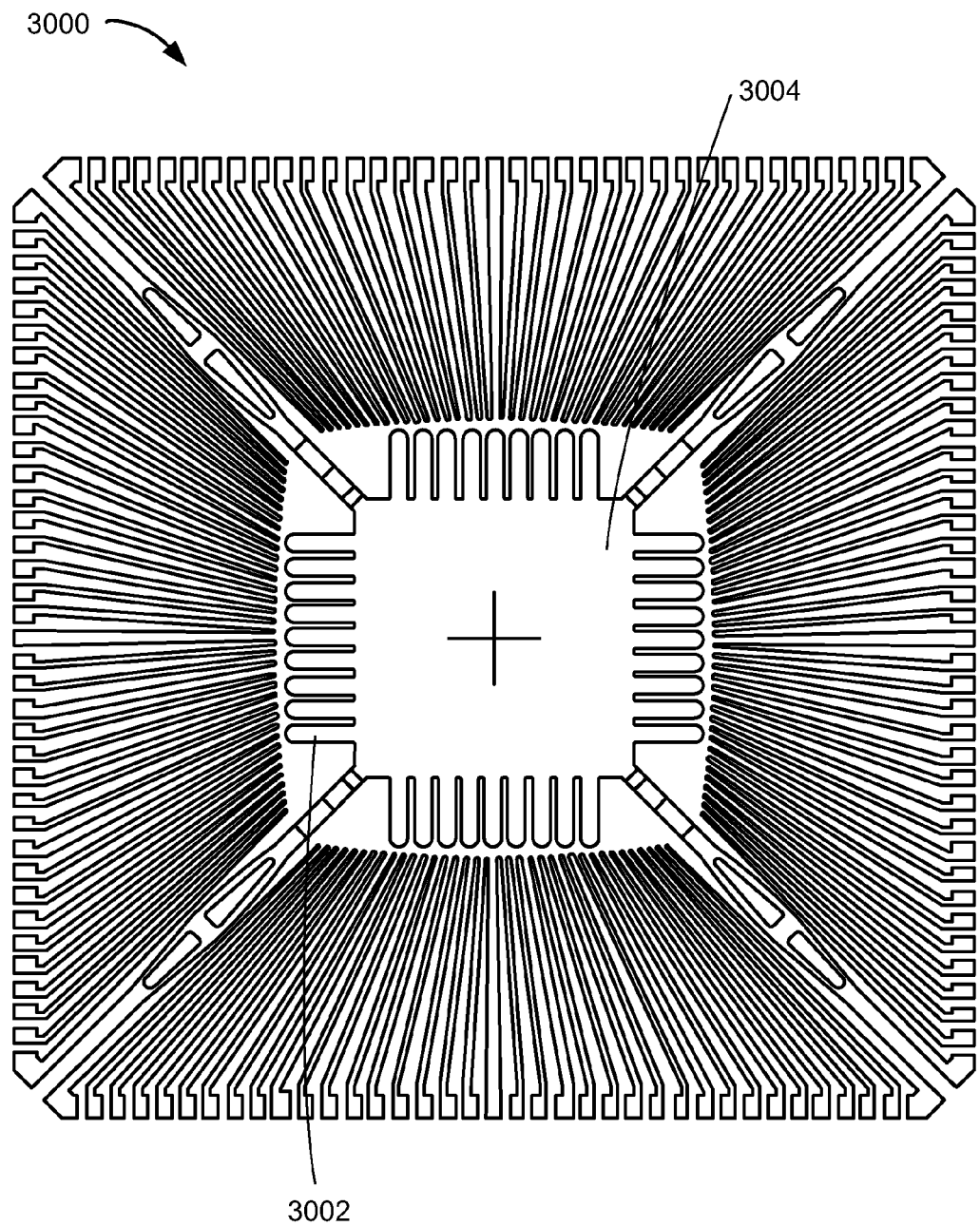
FIG. 30 is a top view of an integral paddle with terminal extensions in an intermediate step of forming the integrated circuit package system of FIG. 1.

Referring now to FIG. 30, therein is shown a top view of an integral paddle 3000 having terminal extensions 3002 in an intermediate step of forming the integrated circuit package system 100 of FIG. 1. The integral paddle 3000 includes a paddle portion 3004 for mounting the integrated circuit die 230 of FIG. 2. The integral paddle 3000 is cut in the manufacturing process of the integrated circuit package system 100 to isolate each of the terminal extensions 3002 from the paddle portion 3004 forming the terminal pads 106 of FIG. 0139 Referring now to FIG. 31, therein is shown a top view of an integral paddle 3100 having terminal extensions 3102 in an intermediate step of forming the integrated circuit package system 900 of FIG. 9. The integral paddle 3100 includes a paddle portion 3104 for mounting the integrated circuit die 1030 of FIG. 10. The integral paddle 3100 is cut in the manufacturing process of the integrated circuit package system 1300 of FIG. 13 to isolate each of the terminal extensions 3102 from dam bars 3106 to forming the terminal pads 906 of FIG. 9.

Figure 32:
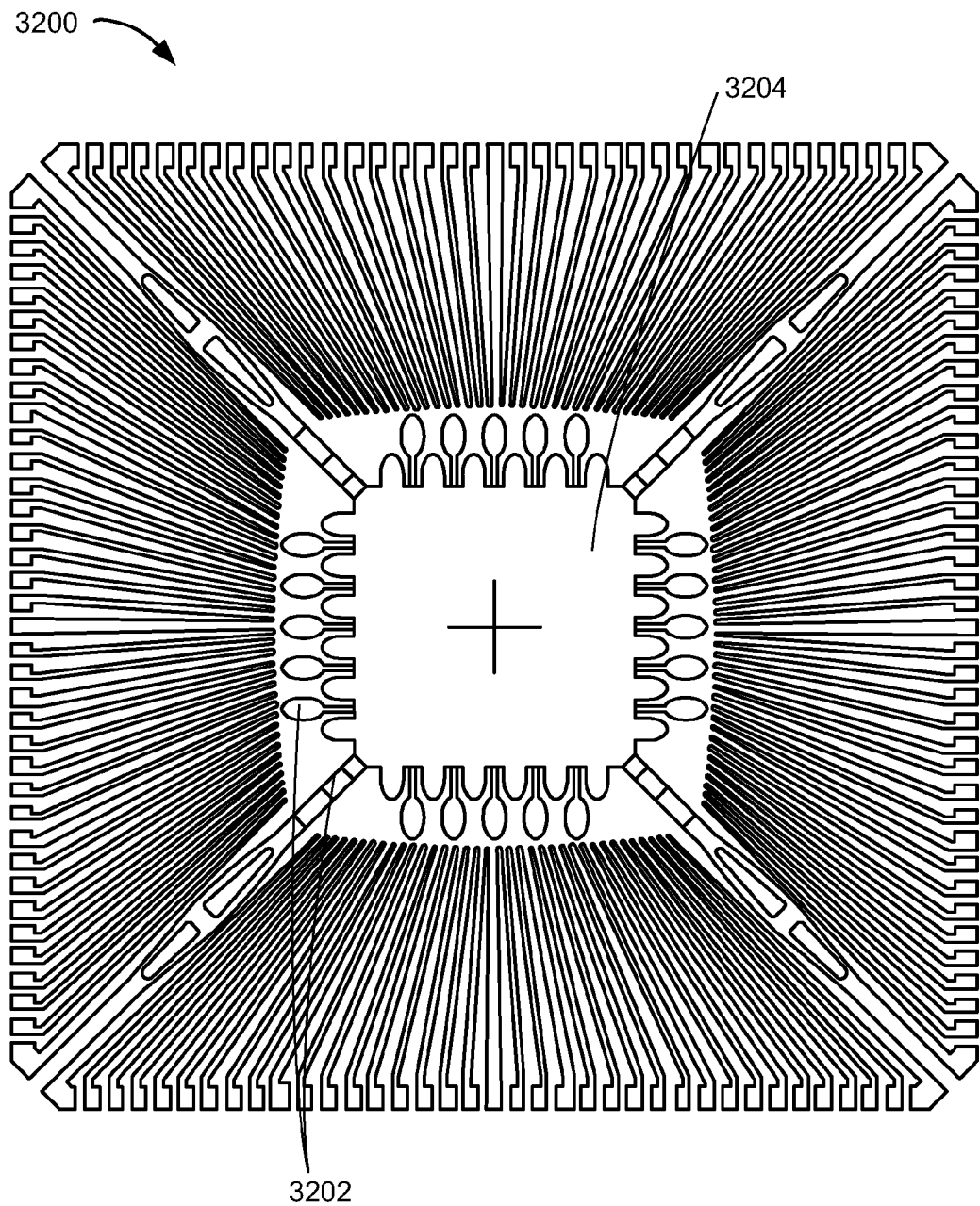
FIG. 32 is a top view of an integral paddle with terminal extensions in an intermediate step of forming the integrated circuit package system of FIG. 13.

Referring now to FIG. 32, therein is shown a top view of an integral paddle 3200 having terminal extensions 3202 in an intermediate step of forming the integrated circuit package system 1300 of FIG. 13. The integral paddle 3200 includes a paddle portion 3204 for mounting the integrated circuit die 1430 of FIG. 14. The integral paddle 3200 is cut in the manufacturing process of the integrated circuit package system 1300 to isolate each of the terminal extensions 3202 from the paddle portion 3204 forming multi-rows of the terminal pads 1306 of FIG. 13.

Figure 33:
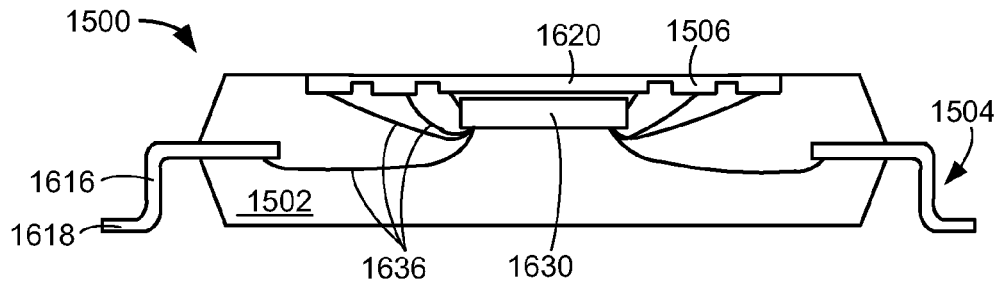
FIG. 33 is a cross-sectional view of the integrated circuit package system of FIG. 16 in an intermediate step.

Referring now to FIG. 33, therein is shown a cross-sectional view of the integrated circuit package system 1500 of FIG. 16 in an intermediate step. The encapsulation 1502 covers the integrated circuit die 1630 and the electrical interconnects 1636. The encapsulation 1502 partially covers the die-attach paddle 1620, the terminal pads 1506 and the external interconnects 1504. As shown in this step, the die-attach paddle 1620 is integral with the terminal pads 1506. Preferably, the post 1616 and the termination 1618 of the external interconnects 1504 are also exposed by the encapsulation 1502.

Figure 34:
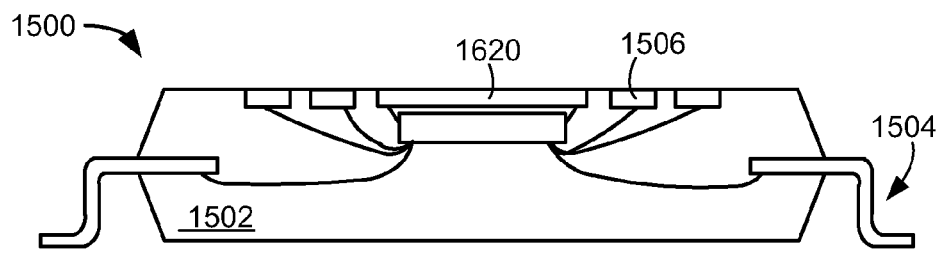
FIG. 34 is the structure of FIG. 33 in a grinding step for forming the integrated circuit package system.

Referring now to FIG. 34, therein is the structure of FIG. 33 in a grinding step for forming the integrated circuit package system 1500 of FIG. 16. The encapsulation 1502 is partially removed, such as by grinding, to isolate and break the contact between the terminal pads 1506 and the die-attach paddle 1620. The grinding step partially exposes the die-attach paddle 1620 and the terminal pads 1506 from the encapsulation 1502. The encapsulation also exposes the external interconnects 1504.

Figure 35:
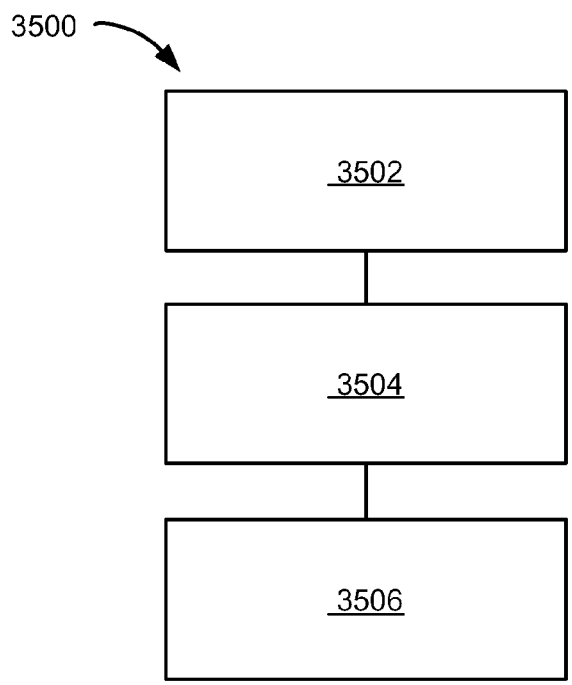
FIG. 35 is a flow chart of an integrated circuit package system for manufacturing the integrated circuit package system in an embodiment of the present invention.

Referring now to FIG. 35 therein is shown a flow chart of an integrated circuit package system 3500 for manufacturing the integrated circuit package system 100 in an embodiment of the present invention. The system 3500 includes forming a die-attach paddle, a terminal pad, and an external interconnect below the terminal pad in a block 3502; connecting an integrated circuit die with the terminal pad and the external interconnect in a block 3504; forming an encapsulation having a first encapsulation side and a second encapsulation side, opposing to the first side surrounding the integrated circuit die with the terminal pad exposed at the first encapsulation side and the external interconnect extending below the second side in a block 3506.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method for manufacturing an integrated circuit package system comprising:
    forming a die-attach paddle, a terminal pad, and an external interconnect with the die-attach paddle having a recess completely bounded by a non-horizontal extent at an obtuse angle with a first paddle side and with the external interconnect below and isolated from the terminal pad;
    connecting an integrated circuit die with the terminal pad and the external interconnect; and
    forming an encapsulation, having a first side and a second side at an opposing side to the first side, surrounding the integrated circuit die with the terminal pad exposed at the first side and the external interconnect extending below the second side.

2. The method as claimed in claim 1 further comprising partial cutting the encapsulation adjacent to the terminal pad wherein the partial cutting includes partial sawing, isolation drilling, grinding, and etching.

3. The method as claimed in claim 1 further comprising partial cutting the encapsulation between the die-attach paddle and the terminal pad wherein the partial cutting includes partial sawing, isolation drilling, grinding, and etching.

4. The method as claimed in claim 1 wherein forming the die-attach paddle and the terminal pad includes forming the terminal pad integral with the die-attach paddle.

5. The method as claimed in claim 1 wherein forming the encapsulation includes exposing the die-attach paddle coplanar with the terminal pad.

6. A method for manufacturing an integrated circuit package system comprising:
    forming a die-attach paddle, a terminal pad, and an external interconnect with the die-attach paddle having a recess completely bounded by a non-horizontal extent at an obtuse angle with a first paddle side and with the external interconnect below and isolated from the terminal pad;
    mounting an integrated circuit die to the die-attach paddle;

connecting the integrated circuit die with the terminal pad and the external interconnect; and forming a first encapsulation, having a first side and a second side at an opposing side to the first side, surrounding the integrated circuit die with the terminal pad exposed at the first side and the external interconnect extending below the second side.

7. The method as claimed in claim 6 wherein forming the terminal pad includes forming multiple rows of the terminal pads.

8. The method as claimed in claim 6 further comprising mounting an integrated circuit device over the terminal pad.

9. The method as claimed in claim 6 further comprising:
connecting an integrated circuit device to the terminal pad; and
forming a second encapsulation covering the integrated circuit device, the terminal pad, and the first encapsulation with the external interconnect partially exposed.

10. The method as claimed in claim 6 further comprising:
providing a carrier with an electrical connector attached thereunder;
connecting the external interconnect over the carrier;
connecting an integrated circuit device to the terminal pad; and
forming a second encapsulation covering the integrated circuit device, the terminal pad, the first encapsulation, and the external interconnect over the carrier.

11. An integrated circuit package system comprising:
a die-attach paddle having a recess completely bounded by a non-horizontal extent at an obtuse angle with a first paddle side;
a terminal pad adjacent with the die-attach paddle;
an external interconnect below and isolated from the terminal pad;
an integrated circuit die connected with the terminal pad and the external interconnect; and
an encapsulation, having a first side and a second side at an opposing side to the first side, surrounding the integrated circuit die with the terminal pad exposed at the first side and the external interconnect extending below the second side.

12. The system as claimed in claim 11 wherein the encapsulation includes a partial cut adjacent to the terminal pad.

13. The system as claimed in claim 11 wherein the encapsulation includes a partial cut between the die-attach paddle and the terminal pad.

14. The system as claimed in claim 11 wherein the die-attach paddle and the terminal pad are integral to each other.

15. The system as claimed in claim 11 wherein the die-attach paddle is exposed from the encapsulation and coplanar with the terminal pad.

16. The system as claimed in claim 11 wherein the integrated circuit die is mounted to the die-attach paddle.

17. The system as claimed in claim 16 wherein the terminal pad includes multiple rows of the terminal pads.

18. The system as claimed in claim 16 further comprising an integrated circuit device over the terminal pad.

19. The system as claimed in claim 16 further comprising:
an integrated circuit device connected to the terminal pad; and
a package encapsulation covering the integrated circuit device, the terminal pad, and the encapsulation with the external interconnect partially exposed.

20. The system as claimed in claim 16 further comprising:
a carrier having an electrical connector thereunder and the external interconnect mounted over the carrier;
an integrated circuit device connected to the terminal pad; and
a package encapsulation covering the integrated circuit device, the terminal pad, the encapsulation, and the external interconnect over the carrier.

* * * * *

UNITED STATES PATENT AND TRADEMARK OFFICE
CERTIFICATE OF CORRECTION

| | | |
|---|---|---|
| PATENT NO. | : 8,120,150 B2 | Page 1 of 1 |
| APPLICATION NO. | : 11/857402 | |
| DATED | : February 21, 2012 | |
| INVENTOR(S) | : Badakere Govindaiah et al. | |

It is certified that error appears in the above-identified patent and that said Letters Patent is hereby corrected as shown below:

In the Specification:

Column 5, lines 42-44, delete "such as a printed circuit board or a further integrated circuit package system. 0058 It has been discovered that the present invention provides the" and insert therefor --such as a printed circuit board or a further integrated circuit package system.¶
 It has been discovered that the present invention provides the--

Figure 31:
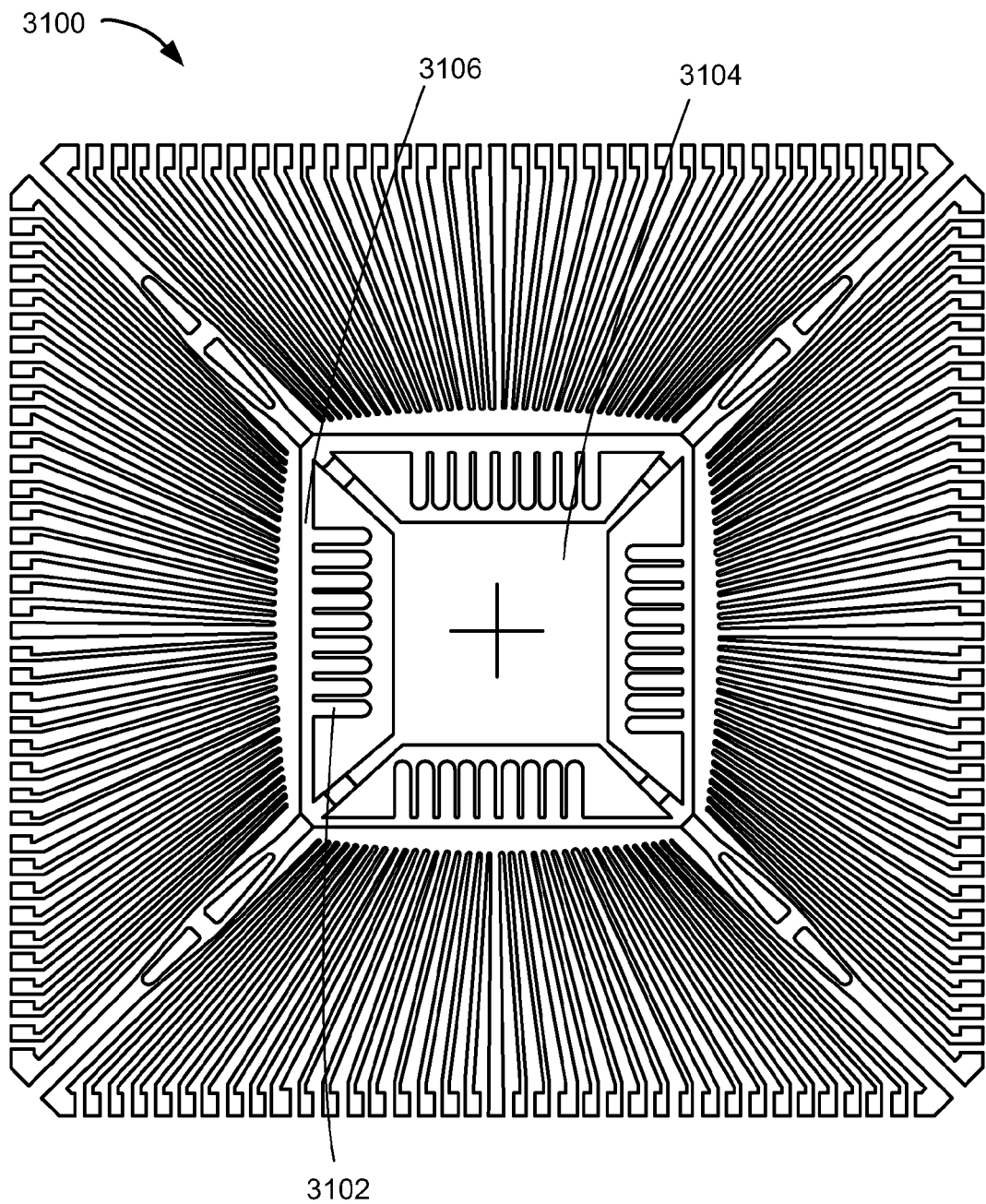
FIG. 31 is a top view of an integral paddle with terminal extensions in an intermediate step of forming the integrated circuit package system of FIG. 9.

Column 17, lines 17-18, delete "the terminal pads 106 of FIG. 0139 Referring now to FIG. 31, therein is shown" and insert therefor --the terminal pads 106 of FIG. 1.¶
Referring now to FIG. 31, therein is shown--

Signed and Sealed this
Eighteenth Day of February, 2014

Michelle K. Lee
*Deputy Director of the United States Patent and Trademark Office*